US008103988B2

(12) United States Patent  (10) Patent No.: US 8,103,988 B2
Pfeil et al.  (45) Date of Patent: Jan. 24, 2012

(54) USE OF BREAKOUTS IN PRINTED CIRCUIT BOARD DESIGNS

(75) Inventors: Charles L. Pfeil, Boulder, CO (US); Henry Potts, Ft. Collins, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 11/937,411

(22) Filed: Nov. 8, 2007

(65) Prior Publication Data

US 2008/0178139 A1  Jul. 24, 2008

Related U.S. Application Data

(60) Provisional application No. 60/864,969, filed on Nov. 8, 2006, provisional application No. 60/864,970, filed on Nov. 8, 2006.

(51) Int. Cl.
*G06F 17/50* (2006.01)
(52) U.S. Cl. ........................................ 716/100
(58) Field of Classification Search .............. 716/1, 2, 716/15, 100
See application file for complete search history.

(56) References Cited

U.S. PATENT DOCUMENTS

| 5,450,290 | A | 9/1995 | Boyko |
| 5,757,656 | A * | 5/1998 | Hershberger et al. ............ 716/13 |
| 5,784,262 | A | 7/1998 | Sherman |
| 6,150,729 | A | 11/2000 | Ghahghahi |
| 6,198,635 | B1 | 3/2001 | Shenoy |
| 6,373,139 | B1 | 4/2002 | Clark |
| 6,388,890 | B1 | 5/2002 | Kwong |
| 6,406,936 | B1 | 6/2002 | Juneja |
| 6,545,876 | B1 | 4/2003 | Kwong |
| 6,720,501 | B1 | 4/2004 | Henson |
| 6,762,366 | B1 | 7/2004 | Miller |
| 6,833,615 | B2 | 12/2004 | Geng |
| 7,017,137 | B2 * | 3/2006 | Wadland et al. ................ 716/13 |

(Continued)

FOREIGN PATENT DOCUMENTS

WO  06053891 A1  5/2006

OTHER PUBLICATIONS

Ozdal et al., "An Escape Routing Framework for Dense Boards With High-Speed Design Constraints" Computer-Aided Design IICCAD-2005, Nov. 6, 2005, pp. 759-766, ICCAD-2005 IEEE/ACM International Conference, IEEE, Piscataway, NJ.

(Continued)

*Primary Examiner* — Suchin Parihar

(57) ABSTRACT

An escape outline is provided to automatically identify escape traces of a breakout. Further, the escape outline can be used to associate desired properties with the identified escape traces and allows special behavior of the automatic and interactive routing routines that operate on the escapes. Still further, an escape outline may be employed to improve the creation of escape traces by automatic routing tools. The use of pseudo-pins for netline optimization also is provided. Breakouts in a printed circuit board design are analyzed, and their respective endpoints are identified. These endpoints are then employed in a netline optimization analysis instead of the pins from which the breakouts originate. In this manner, the endpoints of the breakout are used as pseudo-pins to substitute for the actual pins of a component. Because the netline optimization will then be predicated upon the breakout endpoints rather that the originating pins, the pin configuration will be revised to simplify routing to the breakouts.

8 Claims, 18 Drawing Sheets

U.S. PATENT DOCUMENTS

| | | |
|---|---|---|
| 7,051,434 B2 | 5/2006 | Miller |
| 7,061,116 B2 | 6/2006 | McCormick |
| 7,064,279 B2 | 6/2006 | Meyer |
| 7,064,431 B2 | 6/2006 | Singh |
| 7,161,812 B1 | 1/2007 | Thomas |
| 7,343,577 B2* | 3/2008 | Brown .............. 716/15 |
| 7,365,568 B1* | 4/2008 | Trimberger .......... 326/41 |
| 7,444,623 B2* | 10/2008 | Stevens ............. 717/128 |
| 2002/0060318 A1* | 5/2002 | Katz ................. 257/24 |
| 2003/0047348 A1 | 3/2003 | Jessep |
| 2004/0016117 A1 | 1/2004 | Wyrzykowska |
| 2004/0099440 A1 | 5/2004 | Kwong |
| 2004/0136168 A1 | 7/2004 | Duxbury |
| 2004/0212103 A1* | 10/2004 | Kwong et al. ........... 257/786 |
| 2004/0216916 A1 | 11/2004 | Wyrzykowska |
| 2006/0110848 A1* | 5/2006 | Brown ............. 438/106 |
| 2008/0225502 A1* | 9/2008 | Brown ............. 361/772 |
| 2011/0011683 A1* | 1/2011 | Tetsuka et al. ........ 188/24.19 |

OTHER PUBLICATIONS

Ozdal et al., "Simultaneous Escape Routing and Layer Assignment for Dense PCBs" Computer Aided Design ICCAD-2004, Nov. 7, 2004, pp. 822-829, ICCAD-2004, IEEE/ACM International Conference, IEEE, Piscataway, NJ.

Horiuchi et al, "Escape Routing Design to Reduce The Number of Layers in Area Array Packaging", IEEE Transactions on Advanced Packaging, Nov. 1, 2000, vol. 23 No. 4, IEEE, Piscataway, NJ.

* cited by examiner

1101

Escape Outline 1105

USE OF BREAKOUTS IN PRINTED CIRCUIT BOARD DESIGNS

RELATED APPLICATIONS

This application claims priority to U.S. Provisional Patent Application No. 60/864,969, entitled "Optimizing Netlines Using a Pseudo-Pin Location Map," filed on Nov. 8, 2006, and naming Charles Pfeil et al. as inventors, which application is incorporated entirely herein by reference. This application also claims priority to U.S. Provisional Patent Application No. 60/864,970, entitled "Escape Outline," filed on Nov. 8, 2006, and naming Charles Pfeil as inventor, which application is incorporated entirely herein by reference as well.

FIELD OF THE INVENTION

The present invention is directed to improving the use of breakouts during the design of a printed circuit board. Various implementations of the invention may be useful for routing escape traces of breakouts. Other implementations of the invention may alternately or additionally be employed to improve the routability of traces from breakouts in a printed circuit board design.

BACKGROUND OF THE INVENTION

Integrated circuit devices are used in a wide variety of modern appliances, such as computers, automobiles, telephones, televisions, manufacturing tools, satellites and even toys. While even a small integrated circuit device can provide a great deal of functionality, almost every integrated circuit device must be electrically connected to an input or output device, to another integrated circuit device, or to some other electronic component in order to be useful. To provide these electrical connections, integrated circuit devices are typically mounted on a printed circuit board (PCB). Most printed circuit boards have a rigid, planar core. The core may be formed, for example, of a sheet of fiberglass material impregnated with epoxy. Conductive lines or "traces" then are formed on one or both surfaces of the core, to electronically connect the components attached to the printed circuit board. The traces may be formed of any desired conductive material, such as copper. With various manufacturing techniques, material, specific traces may be created by etching a single layer of conductive material in a photolithographic process.

Simple printed circuit boards may have only a single core, with traces on one or both sides of the core. More complex printed circuit boards, however, may have multiple cores, with traces on one or both sides of one or more of the cores. These multilayered printed circuit board also may include layers of insulating material, to prevent traces on adjacent core surfaces from contacting. In addition, a multilayered printed circuit board also will include one or more "vias" to electrically connect two or more different layers of the board. A via is created by drilling or otherwise forming a hole through one or more cores. The walls of the via then may be clad with conductive material to form an electrical connection between the different layers. Alternately or additionally, the entire via may be filled with conductive material to form the electrical connection. Some vias will pass through every layer of the board, while other vias may connect only some of the layers in the board. Some vias, referred to as "blind" vias, will connect only internal layers of the board, and are not connected to either the uppermost or lowermost layers. As will be explained in more detail below, vias are employed where, for example, a component requires more traces than can be routed in a corresponding area of a single board layer. The vias allow the component to connect to traces on other layers of the board.

There are a number of steps performed in the design of a printed circuit board. Initially, a designer will create a schematic diagram for the system to be connected through the printed circuit board. This process includes identifying each component that will be included in the system. A system can include "active" components, such as field programmable gate array (FPGA) integrated circuits or application-specific integrated circuits (ASICs). A system also can include "passive" components, such as connectors formed as an integrated circuit, resistors, capacitors, and inductors. In addition to identifying each component, the schematic design will represent the electrical connections that must be formed between each component. Next, a designer typically will verify the functionality of the system described in the schematic design. The design may, for example, use software modeling tools to ensure that the system described in the schematic will reliably perform the desired operations. If any errors are detected, then the schematic design will be corrected to address the errors, and the functional verification process repeated.

Once the schematic design is finalized, then the designer will create a physical design to implement the schematic design. The designer will begin by selecting a physical location in the design for each component. When a location for a component has been selected, the designer will add a component object, representing that component, to that location in the printed circuit board design. The component object may include a variety of information regarding the physical component it represents, such as the configuration of the connection pins used to electrically connect that component to other components. With an integrated circuit device, for example, the substrate with the integrated circuit will be encased in a package for protection from the environment. The pins serve to provide an electrical connection, through the packaging, to the electrical contacts of the integrated circuit. After the component objects for the components are located in the printed circuit board design, the designer then will attempt to route traces in the printed circuit board design to connect the components as specified in the schematic design.

Various aspects of the system, however, may create a variety of constraints restricting how the designer can route the traces. For example, a component's minimum current requirement may require that the trace supplying that current have a minimum width. Also, traces may require a minimum separation distance to prevent unacceptable crosstalk. Still further, if a component requires a differential pair connection, then the traces used to implement that differential pair may need to have the same length and maintain a constant distance from each other. Timing constraints may limit the length and/or impedance of a trace. Moreover, because a trace cannot cross over another trace, connections between component pins may require routing traces on multiple layers of the printed circuit board.

Accordingly, after creating an initial physical design, a designer may revise it several times before it is finished. These revisions may include, for example, moving the pathways for traces, altering the width of traces at various points along their lengths creating partial traces or "hangers," moving the location of one or more of the components, and rotating the orientation of one or more of the components. Each revision, however, may itself require related revisions. For example, if a component is moved or rotated, then every existing trace associated with that component must be discarded and replaced.

With some components, the designer may even reposition the pins relative to each other. For example, the schematic design may call for first component to output a data signal to a second component. Depending upon how the components are arranged, however, the pin designated for that output signal may be on a side of the first component opposite the second component. Rather than move either of the components, the designer may instead reconfigure the first component so that the data signal is output on another pin closer to the second component. This "pin-swapping" technique is particularly useful for field programmable gate arrays, where the configuration of a circuit layout can readily be changed by reprogramming the gate array.

In order to swap pins efficiently, a designer may employ a netline before routing the traces. A netline is a graphical line rendered in a physical design for a printed circuit board that spans each pin in a "net" (where a "net" is represented by a single node of the schematic design). FIG. 1 illustrates netlines 101 extending between pins 103 of two separate components 105 and 107. Crossing netlines (e.g., netlines 101A and 101B) suggest that routing traces between their associated pins would be complicated, possibly requiring that the traces be routed on separate layers. To simplify the routability of the traces, a designer may employ a pin-swapping algorithm to reduce or eliminate crossing netlines. FIG. 2 illustrates the components shown in FIG. 1, with the pins reconfigured to prevent crossing netlines. Once a revised pin configuration has been determined, the circuit layout of the component is updated to provide the desired pin configuration, and the traces routed between the relevant pins.

After the designer has established a physical design for the printed circuit board, it is analyzed to verify that it meets specified parameters. For example, the design may be analyzed to confirm that it complies with various manufacturing constraints, such as minimum spacing between traces, minimum trace widths, minimum or maximum turn angles for traces, etc. Alternately or additionally, the designer may verify that the signal integrity and timing delays for the physical design meet desired parameters, to ensure that the signals to be carried by the traces will not be degraded by crosstalk, overshoot or undershoot. Still further, the designer may verify that the electromagnetic radiation that will be generated by the physical design will not exceed specified parameters. These verification processes may be performed using, for example, conventional printed circuit board design verification software tools. If any errors are detected, then the physical design will be corrected to address the errors, and the verification processes repeated. Thus, complying with the verification requirements may necessitate several more changes to the physical design.

As integrated circuit devices have evolved to include smaller and more circuits, it has become increasing difficult to create a physical design for a printed circuit board. For example, a D-type positive edge triggered flip-flop circuit may require 14 pins. Whereas an integrated circuit device might have included only a single circuit of this type several years ago, improvements in integrated circuit manufacturing may now allow an even smaller integrated circuit device to include hundreds of these circuits, requiring more than a thousand pins in a reduced area.

New pin configurations have been developed to permit these more complex integrated circuit devices. Many integrated circuit devices, for example, now use a ball grid array (BGA) structure. With a ball grid array, the pins are formed by balls of solder mounted on the bottom of the package encasing the integrated circuit device. The printed circuit board in turn has a corresponding array of pads, formed of a conductive material such as copper, which matches the positions of the solder balls on the integrated circuit device. To connect the integrated circuit device to the printed circuit board, the integrated circuit device is placed on the printed circuit board so that the balls of solder align with the conductive pads. The solder balls then are melted onto the pads, typically in a reflow oven or by using an infrared heater.

While these new pin configuration allow an integrated circuit device to provide a large number of pins in a relatively small area, their compactness increases the difficulty in routing traces to the pins. As shown in FIG. 3, for example, a ball grid array may have a square array of 1760 pins with a spacing of only 1 mm between adjacent pins. With this arrangement, there are only 160 "spaces" between adjacent pins around the perimeter of the array through which to route traces. There are 1600 pins within the perimeter of the array, however. Even if the routing constraints allow two traces to be routed between adjacent pins, traces can be directly routed to only 320 of the pins within the perimeter of the array. While vias to multiple layers can be employed to route traces to more of the remaining 1280 pins, the addition of extra layers significantly increases the cost of manufacturing a printed circuit board. Moreover, even if additional layers are used, the routing for this type pin density will still be very complex. If the component's position in the printed circuit board design is rotated or moved, then all of the previously-routed traces are discarded, and the complex work of routing traces to the pins of the component must be repeated.

To address the complexity of these new pin configurations, some printed circuit board designers will employ "breakouts." As used herein, a breakout includes an "escape" trace running from a pin within a pin array to a location at or beyond the perimeter of the pin array. For example, FIG. 4 illustrates breakouts 401 that may be routed for the pin array 301 shown in FIG. 3. As seen in this figure, each breakout 401 has an endpoint a short distance outside of the perimeter of the pin array 301. If the escape traces are routed on a layer below the top surface of the printed circuit board, then the breakout also will include the via or vias required to connect the pin to the layer on which the escape trace is routed. This type of via is conventionally referred to as a "fanout" via. Still further, if a fanout via is offset from the pin, then the breakout also will include the offset trace required to connect the pin to the offset fanout via. Once breakouts routed to or past the perimeter of the pin array, the designer typically will have more flexibility to route connection traces between the end of the breakouts and other components (or breakouts for other components).

While breakouts help simplify routing for a printed circuit board, they also present a number of problems. For example, when creating escape traces for a breakout, it is difficult for the designer to determine how far the escape traces should extend from the pin. Without a boundary having specific properties appropriate for defining escape traces, not only is it more difficult to add and modify the traces with conventional interactive routing tools, but it is also difficult for automatic routing tools to identify which traces are escapes and apply the appropriate routing behavior for these traces. Moreover, it may be difficult for a designer or an automatic routing tool to distinguish escape traces from "hanger" traces. As shown in FIG. 5, a hanger traces is a trace that does not extend from a pin sufficiently to be considered an escape trace, and thus does not form a breakout. Hanger traces may be manually formed by printed circuit board designer using an interactive routing tool, or may be automatically formed by an automatic routing tool. While hanger traces may appear similar to escape traces, they serve a different function, and are typically treated differently than escape traces.

Further, the use of breakouts reduces the effectiveness of netline optimization analysis. As shown in FIG. 2, the pins were reconfigured to prevent the netlines from crossing, to thereby simplify the process for routing traces to the pins. If new netlines are created from the endpoint of the breakouts, however, then these new netlines may cross over each other as shown in FIG. 6. As previously noted, crossing netlines indicate the that corresponding traces would either need to be routed through different layers of the printed circuit board, require a relatively complex routing path, or both. Thus, as seen in FIG. 6, the use of breakouts can frustrate the advantages offered by pin-swapping based upon a netline optimization analysis.

BRIEF SUMMARY OF THE INVENTION

Aspects of the invention relate to techniques for facilitating the routing of breakouts in a printed circuit board design. According to various implementations of the invention, an escape outline is provided to automatically identify escape traces of a breakout. Further, the escape outline can be used to associate desired properties with the identified escape traces and allows special behavior of the automatic and interactive routing routines that operate on the escapes. Still further, an escape outline according to various implementations of the invention may be employed to improve the creation of escape traces by automatic routing tools.

Other aspects of the invention relate to the use of pseudo-pins for netline optimization. According to various implementations of the invention, breakouts in a printed circuit board design are analyzed, and their respective endpoints are identified. These endpoints are then provided to a netline optimization analysis instead of the pins from which the breakouts originate. In this manner, the endpoints of the breakout are used as pseudo-pins to substitute for the actual pins of a component. Because the netline optimization will then be predicated upon the breakout endpoints rather that the originating pins, the pin configuration will be revised to simplify routing to the breakouts.

These and other features and aspects of the invention will be apparent upon consideration of the following detailed description.

DETAILED DESCRIPTION OF THE INVENTION

Operating Environment

As will be appreciated by those of ordinary skill in the art, printed circuit board design tools are conventionally implemented using computer-executable software instructions executed by one or more programmable computing devices. Accordingly, one or more aspects of the invention may be embodied by the execution of software instructions on a programmable computing device to perform one or more functions according to the invention. Alternately or additionally, one or more aspects of the invention may be embodied by computer-executable software instructions stored on a computer-readable medium for performing one or more functions according to the invention. Accordingly, the components and operation of a generic programmable computer system through which various embodiments of the invention may be employed will first be described with reference to FIG. 7. It should be noted that this operating environment is only one example of a suitable operating environment, however, and is not intended to suggest any limitation as to the scope of use or functionality of the invention. Still other implementations of the invention, for example, could employ purpose-specific hardware, firmware, or some combination of hardware, firmware and software.

Figure 7:
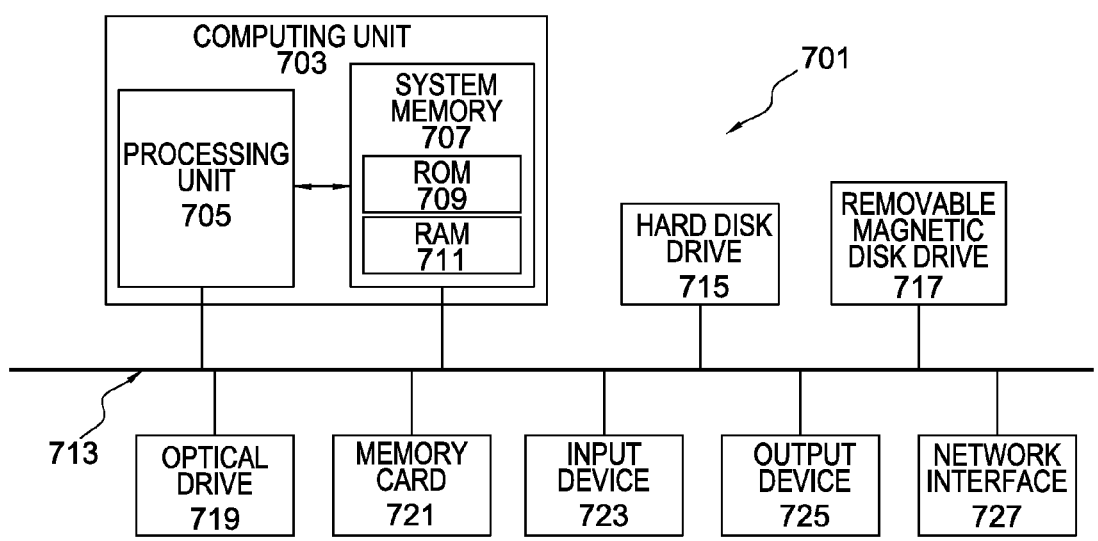
FIG. 7 illustrates a flowchart showing a method that a first portion of an EDA process may use to generate and provide a property value to a second portion of an EDA process.

Turning now to FIG. 7, this figure shows an illustrative example of a computing device 701. As seen in this figure, the computing device 701 includes a computing unit 703 with a processing unit 705 and a system memory 707. The memory 707 may be implemented using any combination of computer readable media that can be accessed by the processing unit 705. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

The processing unit 705 may be any type of programmable electronic device for executing software instructions, but will conventionally be a microprocessor. For example, the processor unit 705 may be a commercially generic programmable microprocessor, such as an Intel® Pentium® or Xeon™ microprocessor, an Advanced Micro Devices Athlon™ microprocessor, or Motorola 68K/Coldfire® microprocessor. Alternately or additionally, the processing unit 705 may be a custom-manufactured processor, such as a microprocessor designed to optimally perform specific types of mathematical operations.

Figure 8:
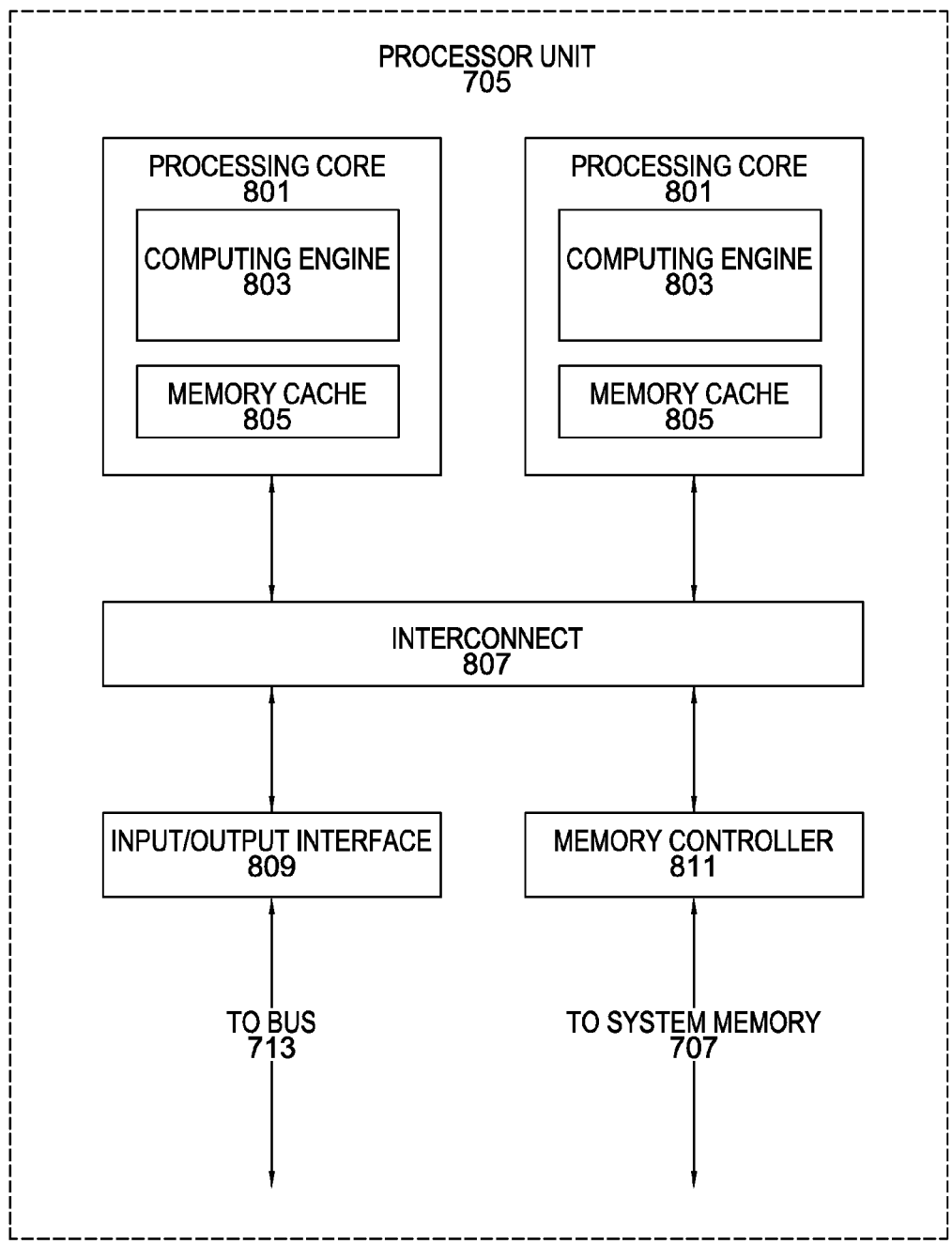
FIG. 8 illustrates an example of a multi-core processor unit that may be employed with various embodiments of the invention.

With some implementations of the invention, the processing unit 505 may have more than one processor core. Accordingly, FIG. 8 illustrates an example of a multi-core processor unit 505 that may be employed with various embodiments of the invention. As seen in this figure, the processor unit 505 includes a plurality of processor cores 801. Each processor core 801 includes a computing engine 803 and a memory cache 805. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 803 may then use its corresponding memory cache 805 to quickly store and retrieve data and/or instructions for execution.

Each processor core 801 is connected to an interconnect 807. The particular construction of the interconnect 807 may vary depending upon the architecture of the processor unit 801. With some processor units 801, such as the Cell microprocessor created by Sony Corporation, Toshiba Corporation and IBM Corporation, the interconnect 807 may be implemented as an interconnect bus. With other processor units 801, however, such as the Opteron™ and Athlon™ dual-core processors available from Advanced Micro Devices of Sunnyvale, Calif., the interconnect 807 may be implemented as a system request interface device. In any case, the processor cores 801 communicate through the interconnect 807 with an input/output interfaces 809 and a memory controller 811. The input/output interface 809 provides a communication interface between the processor unit 801 and the bus 713. Similarly, the memory controller 811 controls the exchange of information between the processor unit 801 and the system memory 707. With some implementations of the invention, the processor units 801 may include additional components, such as a high-level cache memory accessible shared by the processor cores 801.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard" magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-125 may be internally housed with the computing unit 703. Alternately, one or more of the peripheral devices 715-125 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it not intended to be limiting. Various embodiments of the invention may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the invention may be implemented using a multi-processor computer, a plurality of single and/or multiprocessor computers arranged into a network, or some combination of both.

It also should be appreciated that the description of the computer system illustrated in FIGS. 7 and 8 is provided as an example only, and it not intended to suggest any limitation as to the scope of use or functionality of alternate embodiments of the invention.

Escape Outline

According to various implementations of the invention, an escape outline is provided in a printed circuit board design. The escape outline, which typically will enclose a component object, automatically distinguishes escape traces of a breakout from other traces, such as hanger traces. With some embodiments of the invention, for example, a designer may designate a trace as an escape trace for a component simply by routing the trace from a pin of the component to or through the escape outline around that component. Some implementations of the invention may even assist a designer in creating escape traces, by "snapping" traces to the escape outline if the traces have an endpoint within a predetermined distance from the escape outline. Still further, a designer may use an escape outline to automatically route escape traces using an automatic trace routing tool.

As previously noted, various embodiments of the invention are related to tools for the design of printed circuit boards. In particular, some implementations of the invention may be used to improve the operation of printed circuit board design tools for creating and modifying breakout routes in a printed circuit board design. As used herein, the terms "design" and "design data" are intended to encompass data describing an entire printed circuit board. This term also is intended to encompass a smaller set of data describing a subset of an entire printed circuit board, however, such as a layer of an printed circuit board, or even a portion of a layer of an printed circuit board. Still further, the terms "design" and "design data" also are intended to encompass data describing more than one printed circuit board, such as data to be used to create a system of interconnected printed circuit boards. Further, as used herein, the term "designer" is intended to encompass a single person creating, modifying, or otherwise editing a printed circuit board design. This term also is intended to encompass a group of persons, collaborating as a team or working as individuals, that creates, modifies, or otherwise edits a printed circuit board design.

Figure 9:
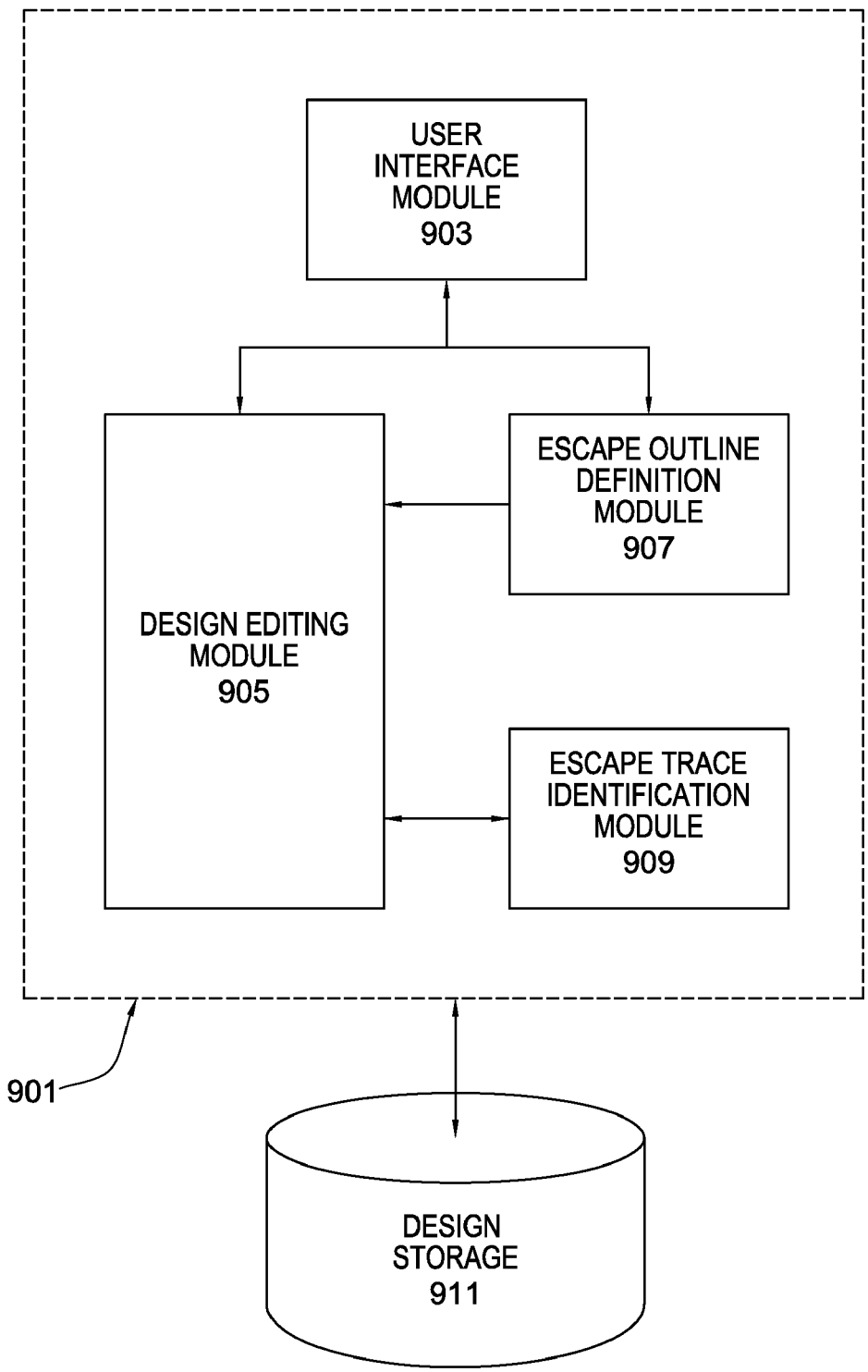
FIG. 9 illustrates a printed circuit board design tool that may incorporate one or more aspects of the invention.

To facilitate an understanding of various embodiments of the invention, one type of software tool for printed circuit board design will now be generally described. More particularly, FIG. 9 illustrates a printed circuit board design tool 901 that may incorporate one or more aspects of the invention. As seen in this figure, the design tool 901 includes a user interface module 903 and a design editing module 905. The user interface module 903 may, for example, provide a graphical user interface that allows a designer to add a trace to a printed circuit board design, modify the route of a trace that already exists in a printed circuit board design, specify one or more properties for a trace, or any other conventional trace editing operation for a printed circuit board design. The design editing module 905 then modifies a printed circuit board design to implement the additions or revisions input through the user interface module 903. In addition, the design editing module 905 may perform one or more automatic editing operations. For example, if a user changes the route of a first trace so that it is too close or overlays a second trace, then the design editing module 905 may automatically revise the route to the second trace to maintain some minimum distance between the first trace and the second trace.

As shown in FIG. 9, the design tool 901 also includes an escape outline definition module 907 and an escape trace identification module 909. As will be discussed in more detail below, the escape outline definition module 907 receives input from a designer, through the user interface module 903, specifying the parameters of an escape outline. In response, the escape outline definition module 907 creates an escape outline in the printed circuit board design based upon the instructions provided by the designer. Once an escape outline has been added to a printed circuit board design, the escape trace identification module 909 will use the escape outline to determine if a trace is an escape trace or some other type of trace.

According to various examples of the invention, the printed circuit board design being edited by the design tool 901 may be stored in a design storage 911. The design storage 911 typically will be implemented by a magnetic disc, such as the type employed by a magnetic hard disc drive. Of course, the design storage 911 alternately may be implemented by any desired memory medium, including, for example, a magnetic disc, an optical disc, a flash or other solid state memory device, including a RAM or ROM memory device, or some combination of these devices. Further, while the design storage 911 is shown as separate from the design tool 901 in FIG. 9, it should be appreciated that some or all of the design storage 911 may be incorporated into the design tool 901.

Figure 1:
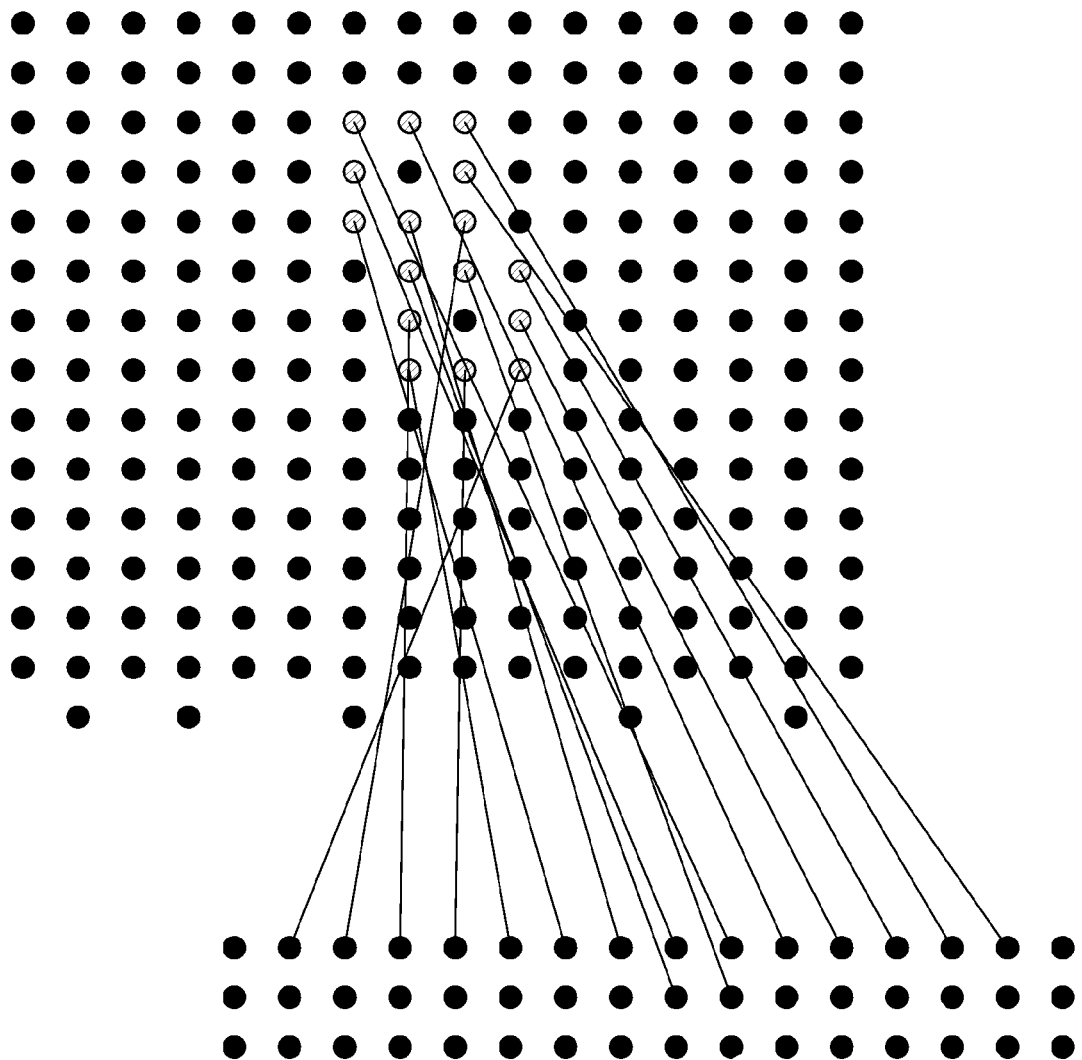
FIG. 1 illustrates netlines extending between pins of two separate components.
Figure 10A:
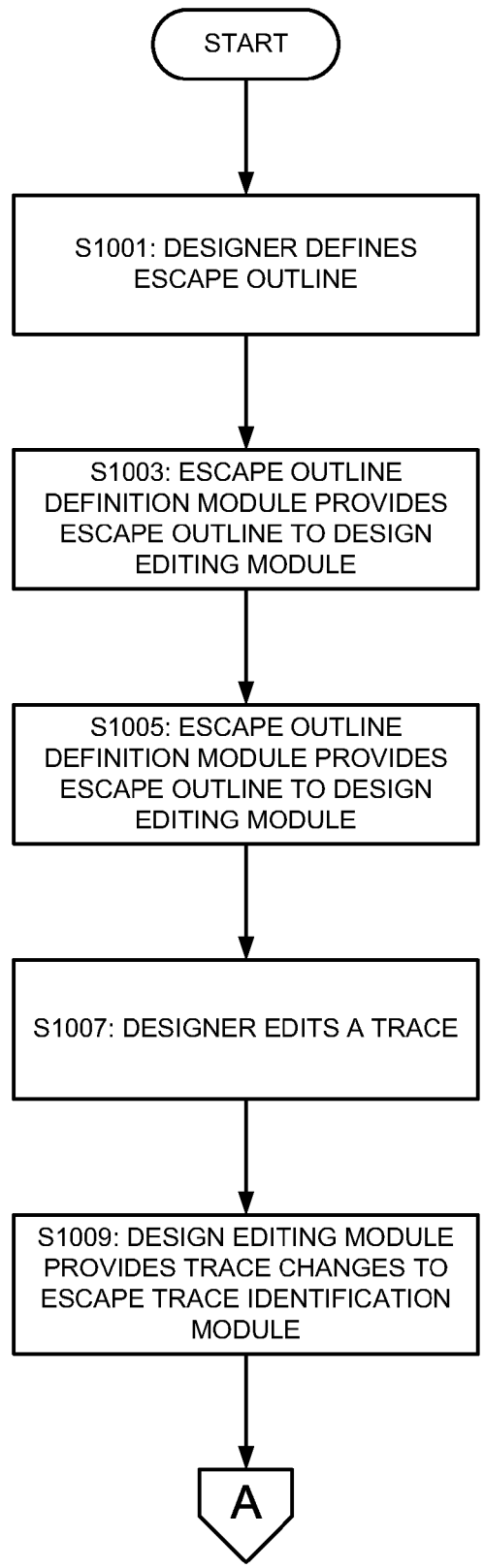
FIGS. 10A and 10B illustrate a flowchart describing the operation of a design tool according to various examples of the invention.
Figure 10B:
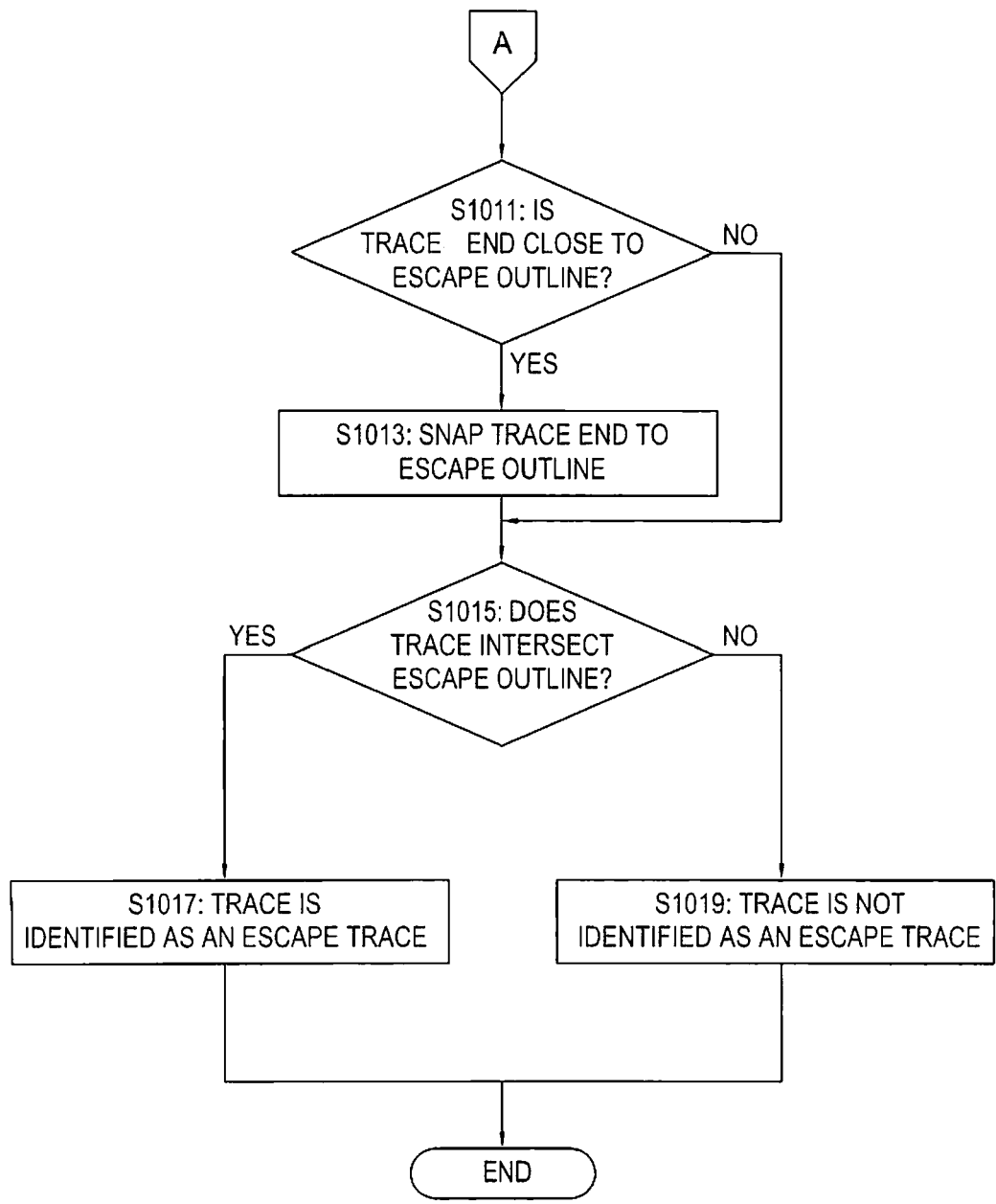

The operation of the design tool 901 according to various examples of the invention will now be described with reference to the flowchart illustrated in FIGS. 10A and 10B. Initially, in step S1001, the designer defines an escape outline in a printed circuit board design so that it is affiliated with a component object in the printed circuit board design. As previously noted, a component object is a data object in a printed circuit board design representing an electrical component that will be mounted on the printed circuit board. The component object may represent any type of component, including active components, such as field programmable gate array device or other powered integrated circuit device. The component object alternately may represent a passive component, such as a connector. FIG. 1A illustrates an example of a component object 1101 representing a component having an array of 1760 pins in a ball grid array. Accordingly, the component object 1101 includes 1760 pins 1103, with the location of each pin 1103 corresponding to the location of a physical solder ball pin of the component.

The designer may input the parameters defining the escape outline through the user interface module 903. With various examples of the invention, the user will specify one or more perimeters for the escape outline, as well as the component object with which the escape outline will be affiliated. According to various examples of the invention, the designer also may specify one or more properties for the escape outline. As will be discussed in more detail below, these properties may be imparted to traces associated with the escape outline. Next, in step S1003, the escape outline definition module 907 adds the escape outline to the printed circuit board design.

Figure 11A:
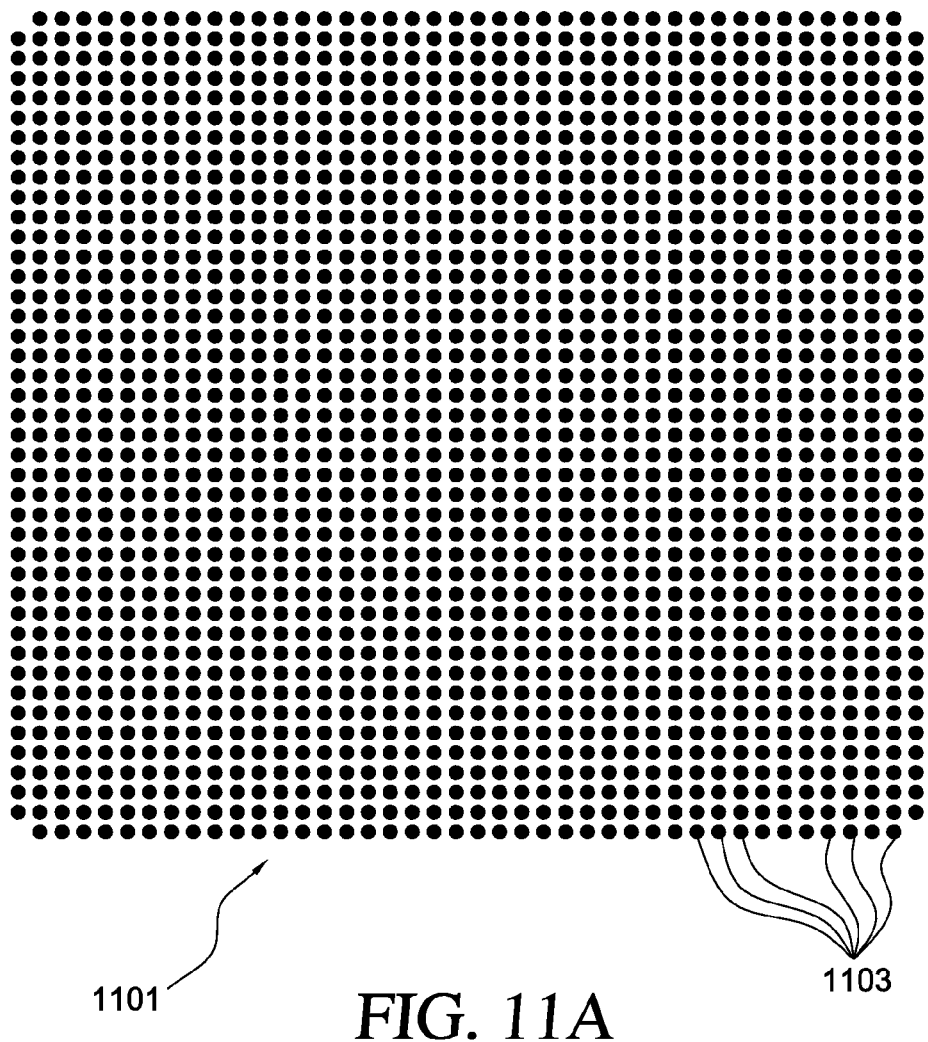
FIGS. 11A-11C illustrates an example of the use of an escape outline for component having an array of 1760 pins in a ball grid array.
Figure 11B:
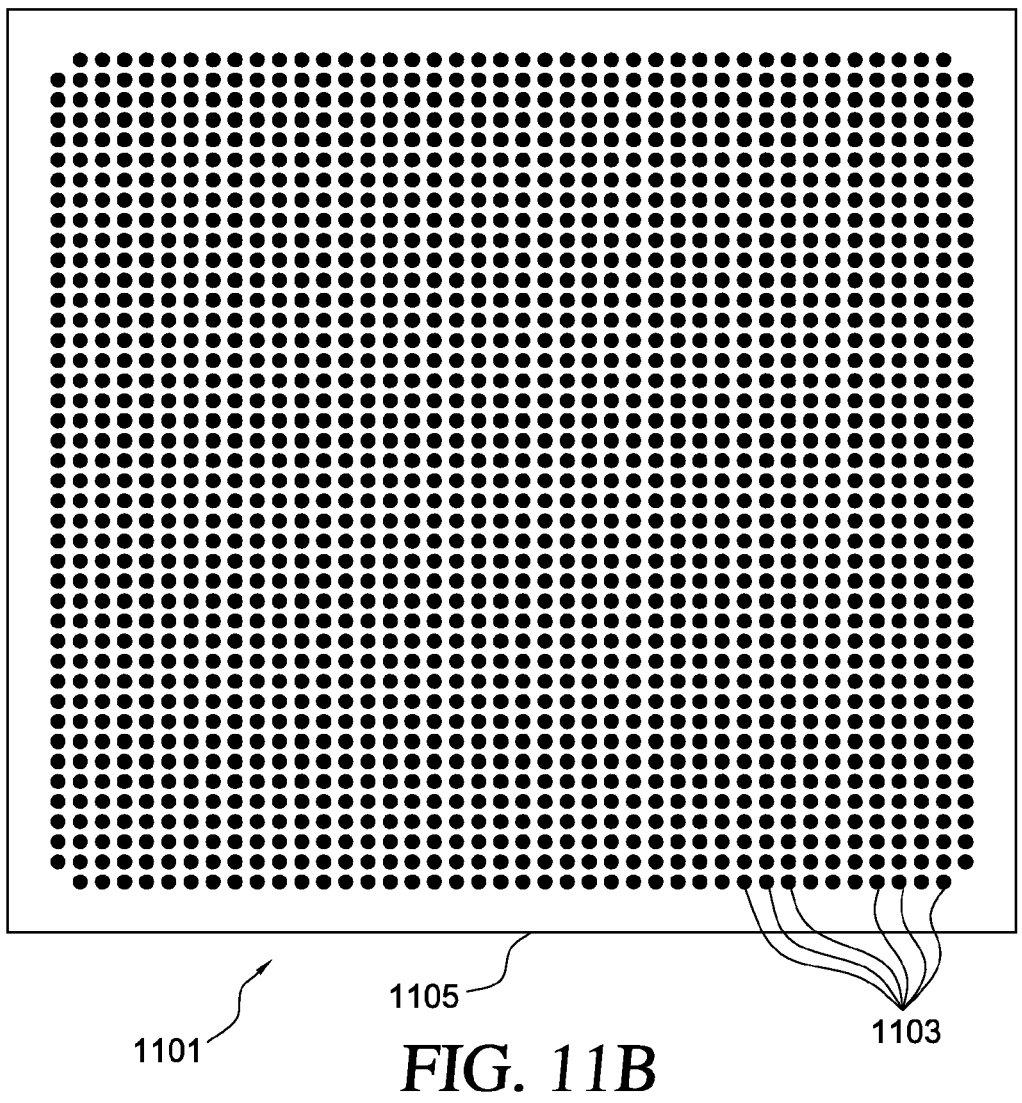

Typically, the designer will create an escape outline so that it surrounds its affiliated component object, like the escape outline 1105 shown in FIG. 11B. In this illustrated example, the perimeter of the escape outline 1105 is the same distance from the corresponding side of the component object 1101. It should be appreciated, however, that with various examples of the invention, the escape outline definition module 907 may allow a designer to specify any desired shape for the perimeter of the escape outline. A user may thus create an escape outline with a perimeter that has some edges closer to its affiliated component object than other edges. Also, in addition to having a rectangularly-shaped perimeter, various implementations of the invention may allow a designer to create an escape outline having a perimeter with other shapes, such as other polygons, circles, ellipses, etc.

It also should be appreciated that an escape outline may exist in a plurality of layers of a printed circuit board design. As previously noted, modern printed circuit boards may have a two or more layers. Accordingly, a designer may specify an escape outline having a perimeter in each of one or more different layers of the printed circuit board design. For example, if the printed circuit board design is for a printed circuit board having six layers, the designer may create an escape outline having a perimeter in the design for each of the six layers. Moreover, the escape outline may exist on only specific layers in a printed circuit board design. Thus, if only the middle four layers of a printed circuit board will be used for routing signal-carrying traces (with the first and sixth layers being used, e.g., only for ground or power planes), then a designer may specify that escape outline exist in only the middle four layers of the printed circuit board design.

Still further, with various examples of the invention, the perimeter of the escape outline may vary from layer to layer of the printed circuit board design. For example, in the top layer of a printed circuit board design, the perimeter of the escape outline may be outside of the periphery of its affiliated component object. In other layers, however, the perimeter of the escape outline may be substantially smaller than the periphery of its affiliated component object. This may be particularly useful, for example, where only a few vias extend from the component object to inner layers of the printed circuit board design. By configuring the perimeter of the escape outline to encompass only those few vias extending from pins of the component object, the designer can preserve space on these inner layers for routing traces unrelated to the component object. It should be noted that various implementations of the invention may allow a user to modify or change features of an escape outline at anytime, include the size and shape of a perimeter of the escape outline, and properties assigned to the escape outline.

Returning now to FIG. 10A, in step S1005, the designer employs the design editing module 905 to edit a trace that extends from a pin of the component object. As used herein, the term "edit" is intended to encompass both creating a new trace and modifying an existing trace. Also, as used herein, the term "extend" is intended to encompass both a direct electrical connection and an indirect electrical connection through one or more intermediary vias or traces. Thus, a trace extending from a pin, as described herein, may extend directly from that pin, or may be connected to the pin through a via which itself is connected to the pin through another trace (or a combination of multiple vias and traces).

Next in step S1009, the design editing module 905 provides the trace edit to the escape trace identification module 909. In response, the escape trace identification module 909 determines if the end of the trace is within a threshold distance of the perimeter of the escape outline (more particularly, the perimeter of the escape outline for the layer in which the trace is routed). If the end of the trace is within the threshold distance of the perimeter of escape outline, then the escape trace identification module 909 instructs the design editing module 905 to "snap" the trace to the escape outline. For example, the design editing module 905 may shorten or extend the trace so that the unconnected end of the trace is positioned on the perimeter of the escape outline.

It should be noted that this type of "snap" commonly employed in computer-aided design programs, such as the Visio design program available from Microsoft Corporation of Redmond, Wash. Moreover, any desired technique for implementing this type of "snap" operation may be employed according to various embodiments of the invention. Accordingly, the implementation of the "snap" operation will not be discussed in further detail.

Returning now to FIG. 10B, in step S1015 the escape trace identification module 909 determines if the trace intersects the escape outline. More particularly, the escape trace identification module 909 determines if the trace crosses over the perimeter of the escape outline or if the end of the trace falls on the perimeter of the escape outline. If the trace does intersect the escape outline, then in step S1017 the escape trace identification module 909 determines that the trace is an escape trace for the component object. With some implementations of the invention, the escape trace identification module 909 may determine that the entire trace is an escape trace. Alternately, with other implementations of the invention, the escape trace identification module 909 may determine that one the portion of the trace falling within the perimeter of the escape outline is an escape trace. If the trace does not intersect the escape outline, then in step S1019 the escape trace identification module 909 determines that the trace is not an escape trace for the component object.

With various implementations of the invention, each of steps S1015 through S1017 may be performed for each trace extending from a pin of the component object as it is edited. The escape trace identification module 909 may, for example, update a Boolean flag value for the trace after it has been edited. With still other examples of the invention, however, steps S1015 through S1017 may be performed concurrently for every trace extending from a pin of the component object. For example, with some implementations of the invention, the escape trace identification module 909 may postpone performing steps S1015 through S1017 until, e.g., a designer makes an edit to the printed circuit board design that would implicate all of the escape traces for the component object, such as a rotation or movement of the component object. The design editing module 905 would then perform steps S1015 through S1017 for each trace extending from a pin of the component object concurrently, identifying the escape traces for the component object at the same time.

It also should be noted that, while a "snap" operation is described above and illustrated in FIG. 10B, various embodiments of the invention may omit this feature. That is, various embodiments of the invention may not provide a snap operation, and may instead require a designer to specifically intersect a trace with the escape outline for that trace to be identified as an escape trace by the escape trace identification module 909.

Figure 12:
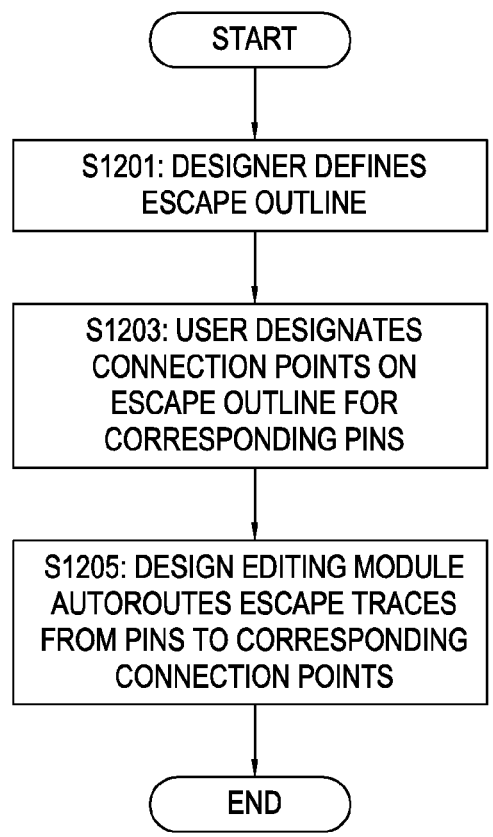
FIG. 12 illustrates a flowchart describing the operation of a design tool according to still other examples of the invention.

While the use of escape outlines can assist a designer in manually creating escape traces, as discussed in detail above, various examples of invention may alternately or additionally facilitate the automatic routing of escape traces using an autorouting operation. For example, rather than manually routing each escape trace to (or through) a point on the escape outline, a designer may instead simply designate a variety of connection points on the escape outline. Based upon these connection points, an autorouting operation can then automatically route traces from pins of the affiliated component object to a corresponding connection point. This aspect of various embodiments of the invention will be discussed with reference to the flowchart shown in FIG. 12.

Initially, in step S1201, the designer defines an escape outline affiliated with a component object, as discussed in detail above. As previously noted, the perimeter of the escape outline may have any desired shape. As also discussed in detail above, the escape outline may have a perimeter on multiple layers of a printed circuit board design. Next, in step S1203, the designer designates one or more connection points along the perimeter (or perimeters) of the escape outline, such that each connection point corresponds to a particular pin of the component object. For example, a designer may create a connection point, C12, which corresponds with pin P12 of the component object. The designer may then create a second connection point, C637, which corresponds with pin P637 of the component object. Next, in step S1205, the design editing module 905 employs an autorouting operation to automatically route breakouts from the pins of the component object to their corresponding connection points along the perimeter (or perimeters) of the escape outline. Thus, the design editing module 905 will automatically route a breakout from the pin P12 to the connection point C12. It also will automatically route another breakout from the pin P637 to the connection point C637.

In this manner, the designer can create a connection point for each pin of the object component that will be connected to another component object. In response, the design editing module 905 (or any other desired routing tool with automatic breakout routing capability) will automatically create a breakout from each pin to its corresponding connection point. Moreover, by specifying the location of each connection point, the designer can control where the breakout terminates. For example, if the designer wishes to connect the pin P12 to another device that positioned to the left of the component object, then the designer can locate the connection point C12 on the left side of the perimeter of the escape outline. Similarly, if the designer wishes to connect the pin P637 to another device that positioned to the right of the component object, then the designer can locate the connection point C637 on the right side of the perimeter of the escape outline.

In addition to directing breakouts in particular directions, a designer can order the connection points along the perimeter of an escape outline to effectively reorder the corresponding pins of the component object. This may be particularly useful for, e.g., application specific integrated circuits, since the pin outputs of this circuit cannot ordinarily be changed as with connectors or field programmable gate array circuits. Further, by allowing a designer to place connection points along perimeters of the escape outline in different layers of the printed circuit board design, various embodiments of the invention may assist an autorouting operation to create breakouts including one or more vias to those different layers.

Figure 11C:
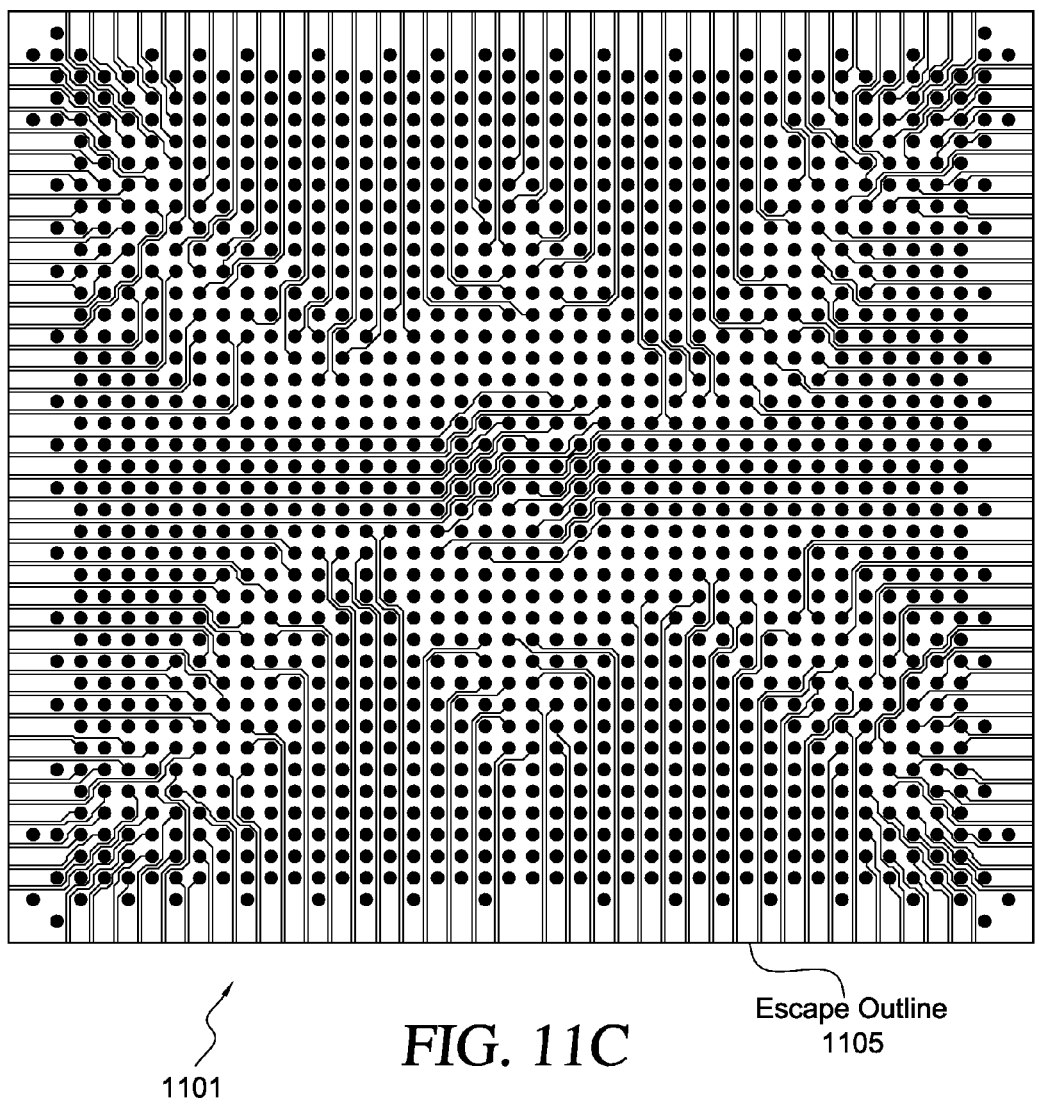

Thus, as will be appreciated from the above description, the escape outline features provided by various implementations of the invention can assist a designer in creating escape traces for breakouts of a component object. By employing various aspects of the invention, a designer can create a breakout for every desired pin of a component object, as illustrated in FIG. 11C. Once the breakouts have been routed, a designer can then perform a second routing operation to route traces from the breakouts to other component objects. Because the breakouts extend outside of the dense pin area of the component object, however, this second routing operation typically will be much simpler than attempting to route traces directly to each relevant pin of the component object. Moreover, because the escape traces of the breakouts extend to or through the escape outline, escape traces of breakouts can be readily distinguished from hanger traces that extend from pins of the component object, but which were not created to extend those pins to any particular net.

As noted above, in addition so simply identifying escape traces, various implementation of the invention may employ an escape outline to associate desired properties with the identified escape traces. For example, with various examples of the invention, a designer can specify a minimum width for escape traces identified by the escape outline that is different from other traces (e.g., non-breakout traces). Similarly, a designer may specify a minimum trace clearance for escape traces identified by the escape outline that are different from other, traces.

Still further, the designer can specify that escape traces (or breakouts containing escape traces) identified by the escape outline be moved or otherwise manipulated with their corresponding component object. Thus, if a designer rotates or inverts a component object, the escape traces (or breakouts containing escape traces) extending from pins of that component object will similarly be rotated and/or inverted, so as to maintain their routing relative to the component object. Similarly, if a designer moves a component object, the escape traces (or breakouts containing escape traces) extending from pins of that component object will similarly be moved, to maintain their routing relative to the component object. Non-escape traces, on the other hand, may be left in their original position and orientation.

Additionally, various implementations can ensure that an identified escape trace will continue to be treated as an escape trace unless the designer specifically indicates otherwise. For example, some editing tools provide a "Push And Move" or similar feature that automatically edits a trace in response to the designer editing an adjacent trace. Thus, if a designer "pushes" a portion of a trace in a leftward direction, these editing tools will automatically push the portions of one or more adjacent traces in a similar manner, in order to maintain a minimum separation distance between the traces. With various implementations of the invention, if these adjacent traces are identified escape traces, then the editing tool will modify these identified escape traces so that they continue to extend to or through the escape outline (and thus will continue to be identified as escape traces). Further, various implementations of the invention may prevent traces from having corners or otherwise being routed along a perimeter of an escape outline.

In addition to associating properties with escape traces, various implementations of invention may be used to associate various properties with non-escape traces (e.g., hangers) falling within a perimeter of the escape outline. For example, in addition to providing a minimum width and/or minimum spacing properties for escape traces, various implementations of the invention may permit a designer to specify minimum width and/or minimum spacing properties for all traces falling within a perimeter of an escape outline, including hangers. Still further, various implementations of the invention may allow a designer to specify that traces within a perimeter of an escape outline be treated differently than traces that exist outside the perimeter (or perimeters) of the escape outline. For example, if a designer activates an automatic operation that globally removes hangers from the printed circuit board design, the designer may specify that hangers existing with a perimeter of an escape outline be exempted from removal.

In addition to associating properties with escape traces or other traces within an escape outline, some implementations of the invention may further allow a designer to associate different properties with escape traces or other traces within an escape outline depend upon the layer in which those traces are routed. For example, a designer may assign a first set of properties to escape traces or other traces falling within the perimeter of an escape outline in a first layer of the printed circuit board design. The designer may then assign a second set of properties to escape traces or other traces falling within another perimeter of the escape outline in a second layer of the printed circuit board design.

While various aspects of the invention have been discussed above with regard to the creation of a new escape outline, it should be appreciated that some implementations of the invention may provide pre-configured escape outlines. For example, according to some implementations of the invention, an object component may included as part of a library item retrieved from a library. With these implementations, the library item also may include a pre-defined escape outline for the component object. Further, the library item also may include pre-routed escape traces that extend to or through the escape outline. With these implementations of the invention, the escape outline can still be used to associate desired properties with escape traces or other traces falling within the escape outline, as discussed above. Alternately or additionally, a designer may use a predefined escape outline to control editing of escape traces or other traces within the escape outline, as also discussed above. Still further, some implementations may allow the designer to modify the perimeters or other aspects of a pre-defined escape outline as desired.

It should be noted that, while an escape outline has been described above with response to a single component object, a designer may employ a plurality of escape outlines in a printed circuit board design, each affiliated with a different component object. Accordingly, each escape outline typically will identify escape traces for pins of only its affiliated component object. Some implementations of the invention may allow a designer to specify different properties for each escape outline, while still other implementations of the invention may alternately or additionally allow a designer to specify one or more global properties for multiple escape outlines.

Pseudo-Pin Mapping

Figure 2:
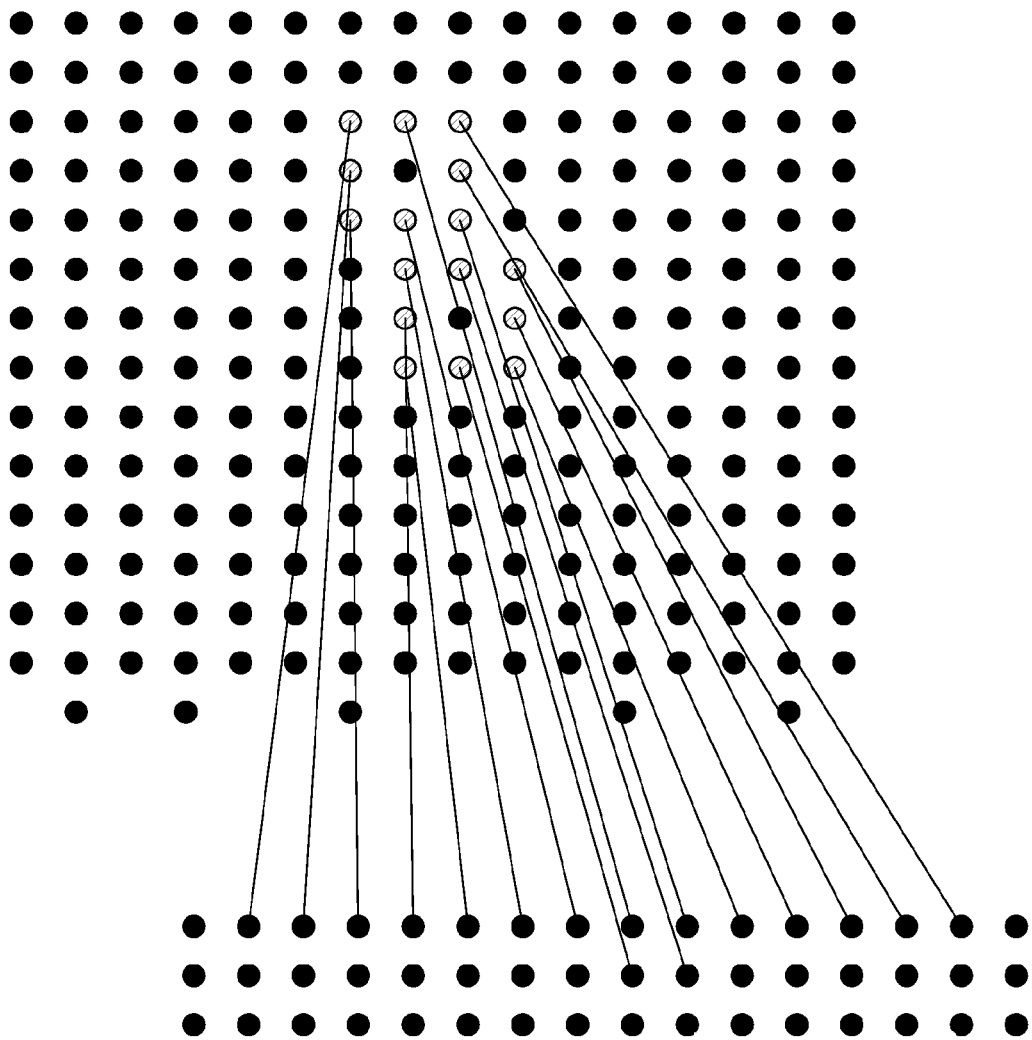
FIG. 2 illustrates the components shown in FIG. 1, with the pins reconfigured to prevent crossing netlines.
Figure 3:
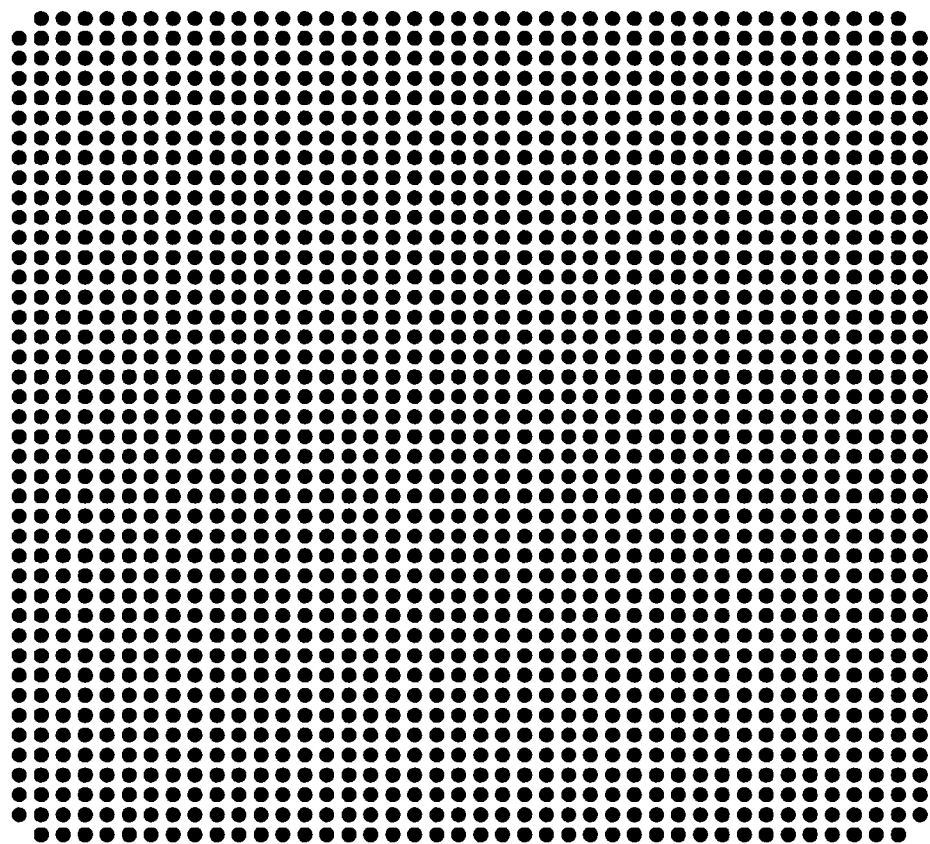
FIG. 3 illustrates a conventional ball grid array.
Figure 4:
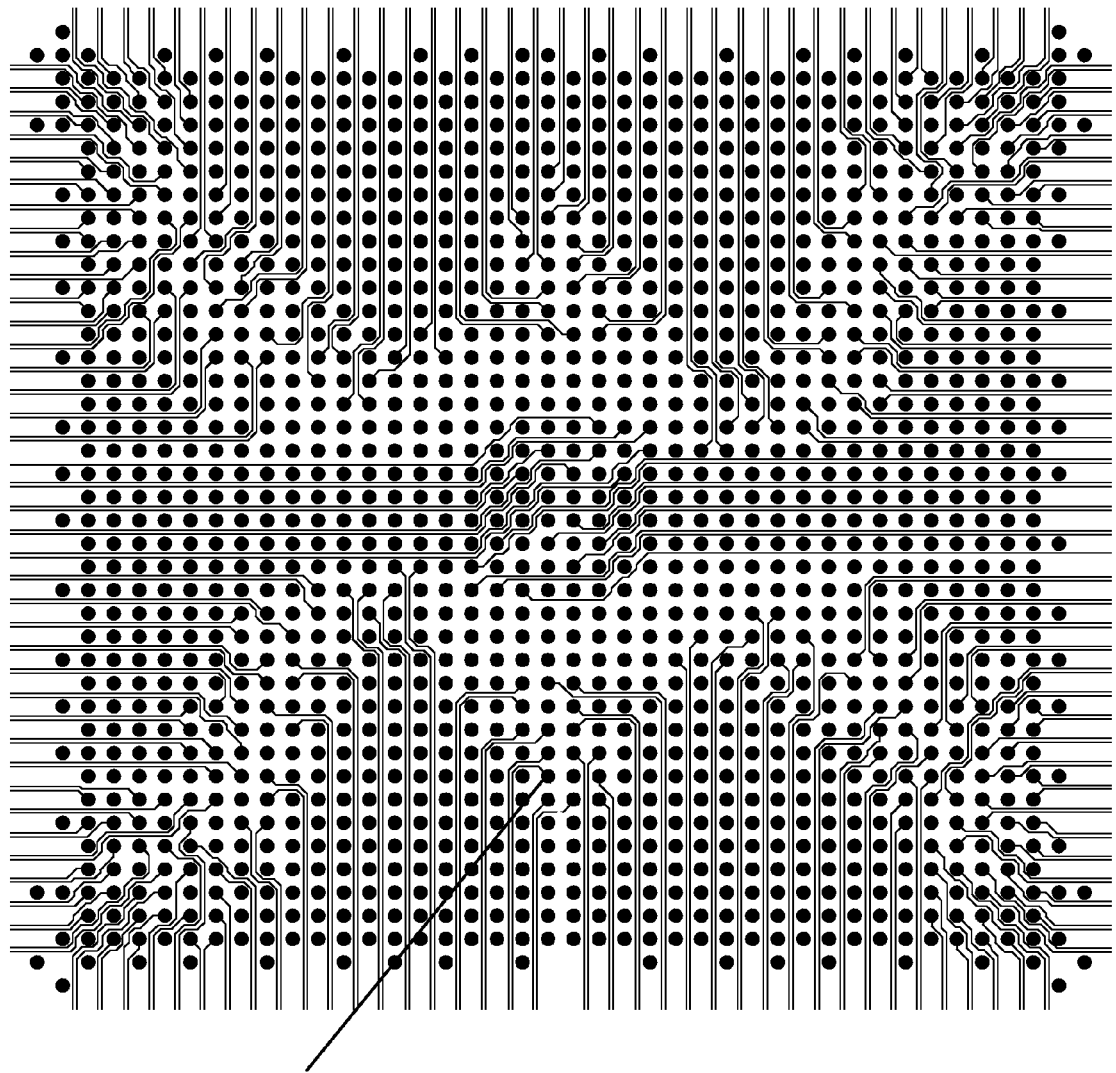
FIG. 4 illustrates breakouts that may be routed for the pin array shown in FIG. 3.
Figure 5:
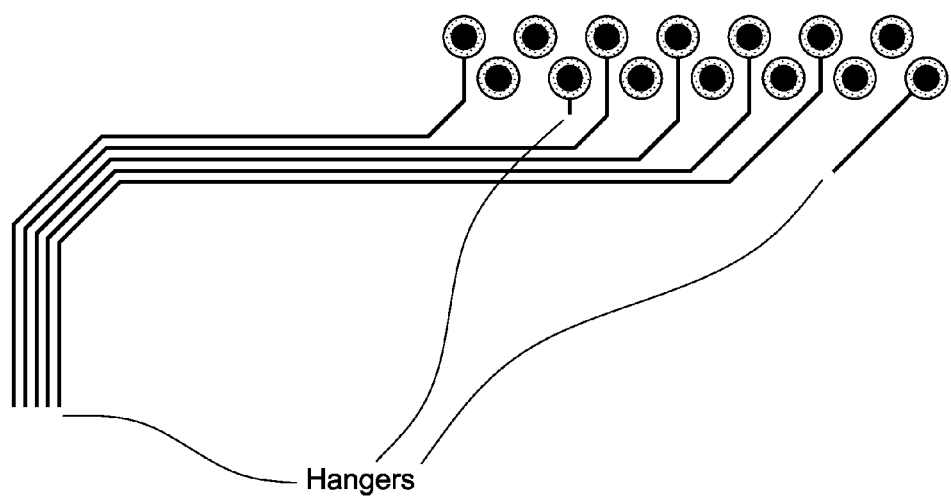
FIG. 5 illustrates various examples of hanger traces.
Figure 6:
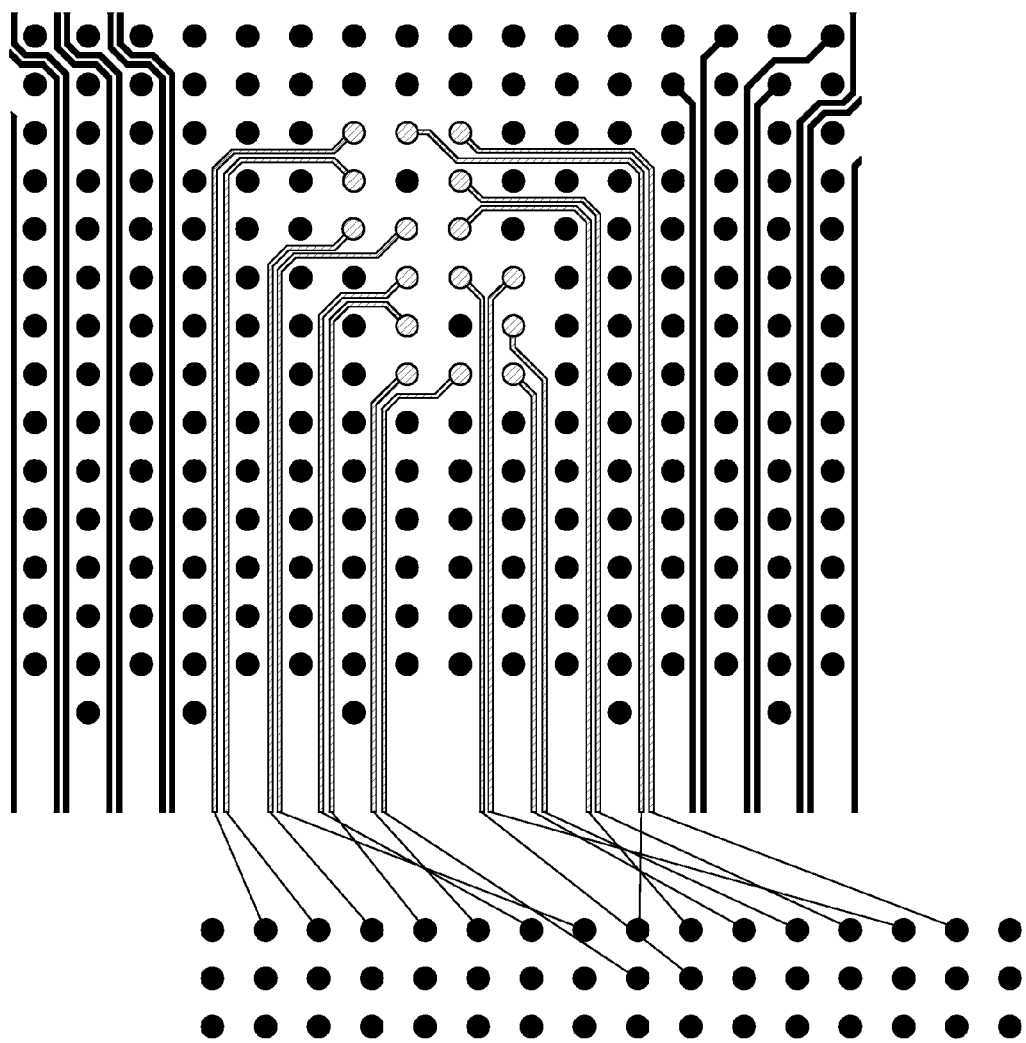
FIG. 6. illustrates netlines extending from the endpoints of the breakouts shown in FIG. 4.

While different implementations of the invention can assist a designer in creating and identifying breakouts, various examples of the may alternately or additionally assist a designer in organizing netlines for traces the include or connect to breakouts. For example, as discussed above, the use of breakouts may reduce the effectiveness of netline optimization analysis. While a netline optimization analysis can be performed at anytime during the design of a printed circuit board, it typically is performed as part of the task of placing component objects in a printed circuit board design. Moreover, netline optimization analysis is usually completed before general routing of traces in the printed circuit board design is begun. Referring back to FIG. 2, this figure shows how pins of a component object were reconfigured to prevent the netlines from crossing, to thereby simplify the process for routing traces to the pins. When breakouts extending from these pins subsequently are created, however, the breakouts may undo or otherwise frustrate the routing advantages provided by reconfiguring the pins based upon a netline optimization analysis. This potential disadvantage to employing breakouts is illustrated in FIG. 6, which show netlines extending from the endpoints of the breakouts rather than the pins. As previously noted, crossing netlines indicate the that corresponding traces would either need to be routed through different layers of the printed circuit board, require a relatively complex routing path, or both.

Various embodiments of the invention may address this potential disadvantage of using breakouts by treating the ends of breakouts as pseudo-pins. These pseudo-pins are then mapped to a netline optimization analysis rather in place of the actual pins from which the breakouts extend. By performing a pin-swapping operation based upon these pseudo-pins rather than the corresponding pins of the component object, the pin-swapping operation can minimize the likelihood that traces extending from the breakouts will cross.

Figure 13:
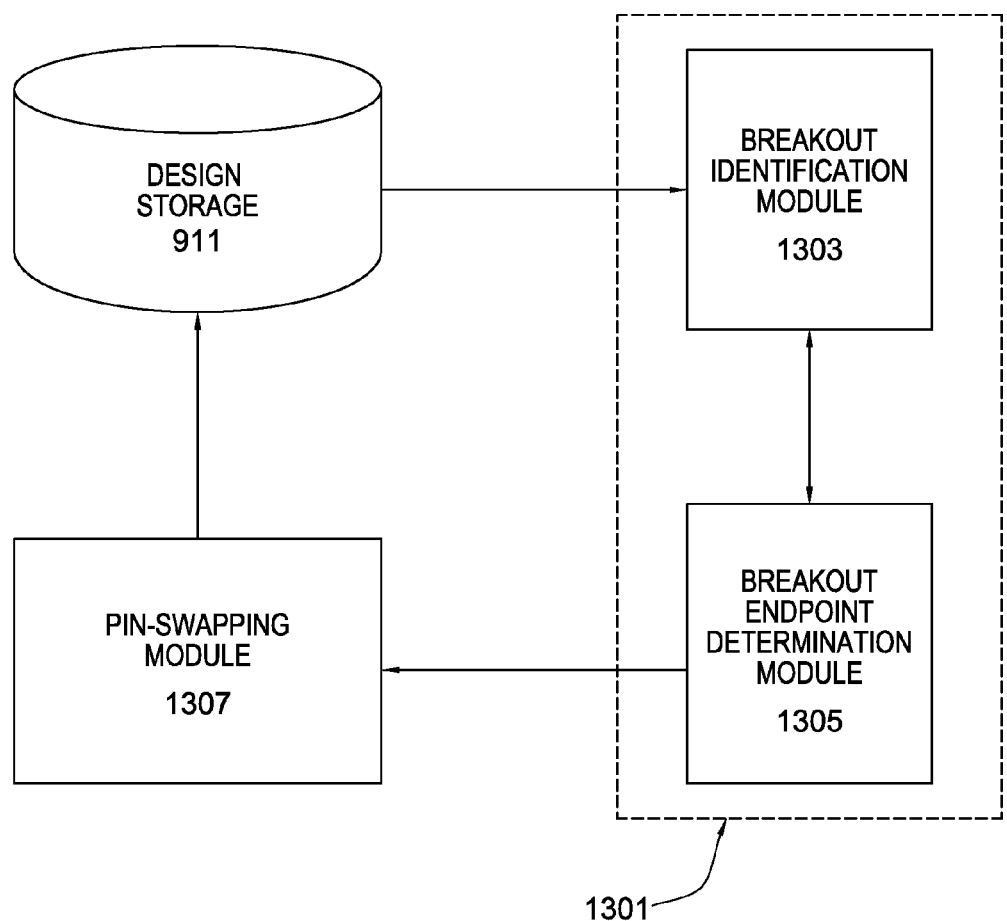
FIG. 13 illustrates an example of a pseudo-pin mapping tool that may be employed according to various examples of the invention.

FIG. 13 illustrates an example of a pseudo-pin mapping tool 1301 that may be employed according to various examples of the invention. As seen in this figure, the pseudo-pin mapping tool 1301 includes a breakout identification module 1303 and a breakout endpoint determination module 1305. The pseudo-pin mapping tool 1301 may receive a printed circuit board design from, e.g., a design storage 911. The design storage 911 typically will be implemented by a magnetic disc, such as the type employed by a magnetic hard disc drive. Of course, the design storage 911 alternately may be implemented by any desired memory medium, including, for example, a magnetic disc, an optical disc, a flash or other solid state memory device, including a RAM or ROM memory device, or some combination of these devices. Further, while the design storage 911 is shown as separate from the pseudo-pin mapping tool 1301 in FIG. 13, it should be appreciated that some or all of the design storage 911 may be incorporated into the pseudo-pin mapping tool 1301.

Figure 14:
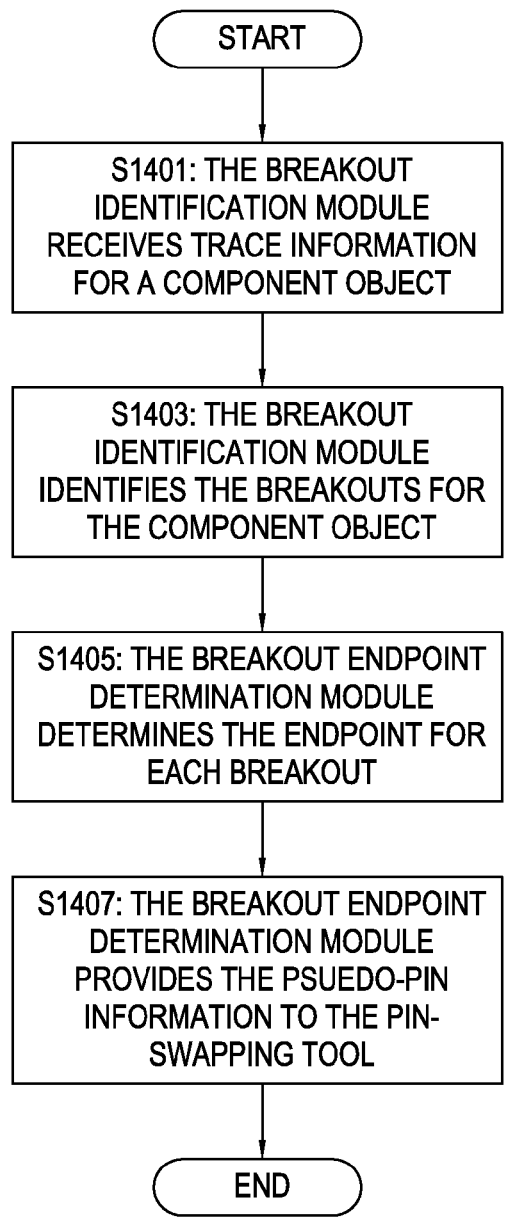
FIG. 14 illustrates a flowchart describing the operation of a pseudo-pin mapping tool according to various examples of the invention.

As will be explained in more detail, the pseudo-pin mapping tool 1301 provides pseudo-pin information to a pin-swapping module 1307. The pin-swapping module may employ any desired conventional pin-swapping tool, such as the pin-swapping tool provided in the IO Designer family of printed circuit board design tools available from Mentor Graphics Corporation of Wilsonville, Oreg. The pin-swapping module 1307 then performs a netline optimization analysis using the pseudo-pin information, and swaps the corresponding pins in the printed circuit board design accordingly. It should be noted that, while the pin-swapping module 1307 also is shown as separate from the pseudo-pin mapping tool 1301 in FIG. 13, some or all of the pin-swapping module 1307 may be incorporated into the pseudo-pin mapping tool 1301. The operation of the pseudo-pin mapping tool 1301 will be discussed in more detail with regard to the flowchart illustrated in FIG. 14.

Initially, in step S1401, the breakout identification module 1303 receives trace information for a component object. Next, in step S1403, the breakout identification module 1303 identifies the breakouts for the component objects. With various examples of the invention, the breakout identification module 1303 may simply identify any trace extending from a pin of the object component as part of a breakout. Still other examples of the invention may identify only those traces extending from a pin of the object component that have a minimum length as part of a breakout. Still other implementations of the invention, however, may additionally provide an escape outline for the object component. With these implementations of the invention, the breakout identification module 1303 can easily identify the escape traces of breakouts as discussed in detail above.

Next, in step S1405, the breakout endpoint determination module 1305 identifies an endpoint for each breakout. For those examples of the invention that do not implement escape outlines (or where an escape outline has not been provided for the component object), the breakout endpoint determination module 1305 may simply determine the endpoint of a breakout as the end point of the trace in the breakout extended furthest from the object component. Where, however, an embodiment of the invention provides an escape outline for the object component, the breakout endpoint determination module 1305 may easily identify the endpoint of the breakout as the point at which a trace of the breakout intersects a perimeter of the escape outline.

In step S1407, the breakout endpoint determination module 1305 provides pseudo-pin information, including the endpoint for each breakout to the pin from which the breakout extends, to the pin-swapping module 1307. That is, the breakout endpoint determination module 1305 designates the identified endpoint of the breakout as a pseudo-pin, and provides the location of this pseudo-pin to the pin-swapping module 1307. The pseudo-pin is information will also include the name of the actual component object pin represented by the pseudo-pin. With various examples of the invention, the pseudo-pin information also may include other information, such as the name of the net to which the object component pin should be connected, layer information for the pseudo-pin where the breakout may traverse multiple layers, the name of the signal to be conveyed by the breakout, etc.

In response to receiving the pseudo-pin information from the breakout endpoint determination module 1305, the pin-swapping module 1307 will perform a netline optimization analysis using the pseudo-pins provided by the pseudo-pin mapping tool 1301, rather than the actual pins of the component object. As known in the art, conventional pin-swapping routines for netline optimization currently build structures that represent a map of the pins of an object component and their associated netlines. If an actual pin has a corresponding pseudo-pin, however, then the pin-swapping module 1307 will use include the location of the pseudo-pin in its map rather than the actual pin. As the pin-swapping operation is performed based upon the netline optimization analysis, the pseudo-pin mapping tool 1301 can then use the pseudo-pin information to determine which actual pins of the component object should be reordered to optimize the netline arrangement.

Figure 15:
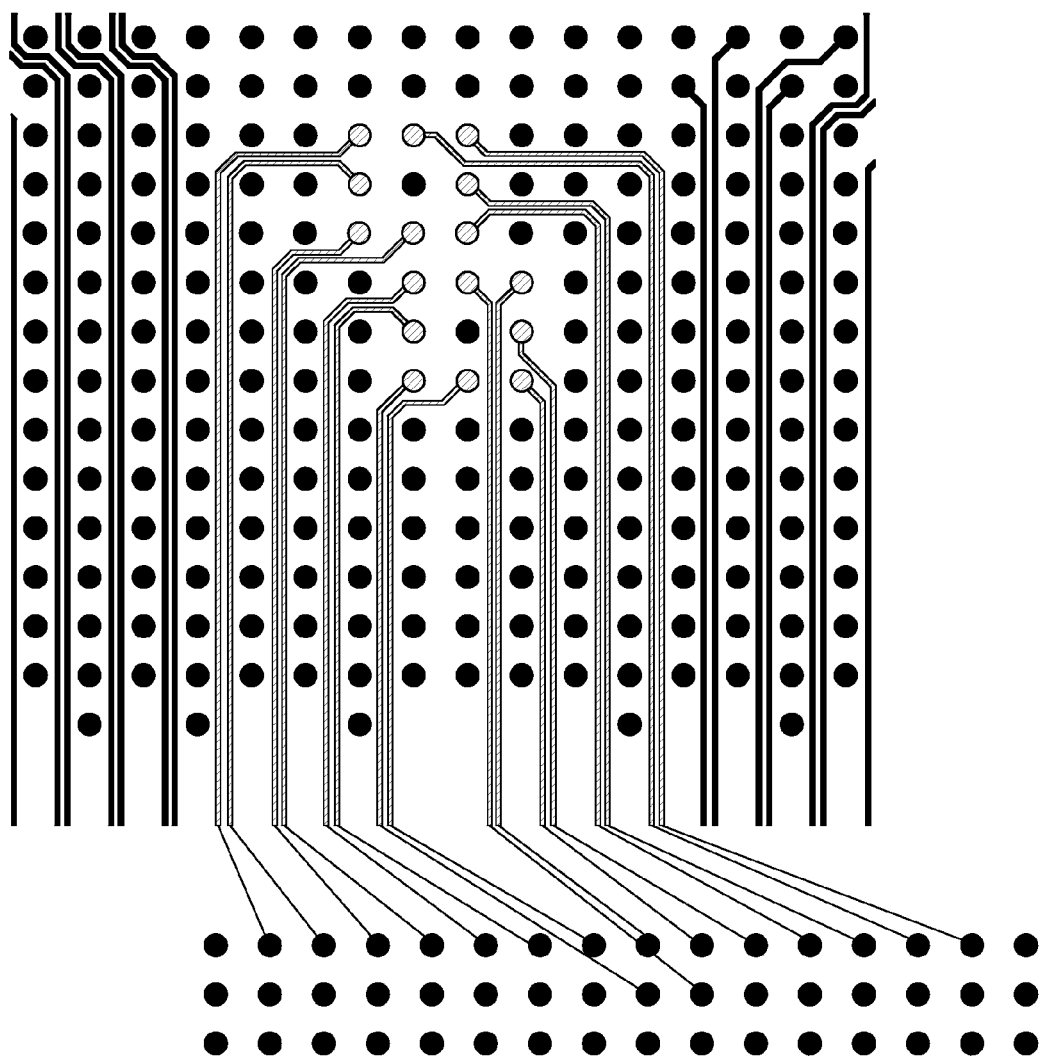
FIG. 15 illustrates the optimization of netlines using a pseudo-pin mapping tool according to various examples of the invention.

For example, the pin-swapping module 1307 may create a first netline extending from a pseudo-pin P21' and a second netline extending from a pseudo-pin P365'. In the course performing a netline optimization analysis to optimize the arrangement of the netlines, the pin-swapping module 1307 may determine that the location of pseudo-pin P21' should be swapped with the location of pseudo-pin P365'. In response, the pseudo-pin mapping tool 1301 can then correctly swap the actual pin P21 with the actual pin P365. In this manner, the actual pins of the component object can be reordered so as to reduce the likelihood that their corresponding breakouts will create crossing netlines, as illustrated in FIG. 15.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A computer-implemented method of swapping pins in a printed circuit board design, comprising:
    identifying traces that extend from a pin of a component object in the printed circuit board design and intersect a perimeter of an escape outline affiliated with the component object as breakouts;
    identifying endpoints of the breakouts; and
    providing the identified endpoints to a pin-swapping tool for use in a netline optimization process.

2. The computer-implemented method recited in claim 1, further comprising identifying the endpoints of the breakouts as the intersections of the traces of the breakouts with the perimeter of the escape outline affiliated with the component object.

3. The computer-implemented method recited in claim 1, further comprising:
    creating a map of pins of the component object including the pseudo-pins corresponding to the breakout endpoints;
    creating netlines extending from the pseudo-pins; and
    performing a netline optimization process using the netlines extending from the pseudo-pins.

4. The computer-implemented method recited in claim 3, further comprising:
    identifying two pseudo-pins to be swapped based upon the netline optimization process using the netlines extending from the pseudo-pins; and
    swapping actual pins of the component object corresponding to two identified pseudo-pins to be swapped.

5. A computer-readable storage medium, having a sequence of program instructions stored thereon that are executable by a computer system to perform the method of any claims 1 and 2-4.

6. A pseudo-pin mapping tool, comprising:
    a breakout identification module configured to identify breakouts extending from a pin of a component object in the printed circuit board design; and
    a breakout endpoint determination module configured to, for each identified breakout,
    identify an endpoint of the breakout; and
    provide the identified endpoint to a pin-swapping tool for use in a netline optimization process.

7. The pseudo-pin mapping tool recited in claim 6, further comprising:
    a pin-swapping module configured to
        create a map of pins of the component object using pseudo-pins corresponding to the breakout endpoints;
        create netlines extending from the pseudo-pins; and
        perform a netline optimization process using the netlines extending from the pseudo-pins.

8. The pseudo-pin mapping tool recited in claim 7, wherein the pin-swapping module is further configured to
    identify two pseudo-pins to be swapped based upon the netline optimization process using the netlines extending from the pseudo-pins; and
    swap actual pins of the component object corresponding to two identified pseudo-pins to be swapped.

* * * * *